(12) United States Patent
Hosoda (10) Patent No.: US 7,713,678 B2
(45) Date of Patent: May 11, 2010

(54) RESIST MATERIAL AND ELECTRON BEAM RECORDING RESIST MATERIAL

(75) Inventor: Yasuo Hosoda, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 11/921,327

(22) PCT Filed: May 26, 2006

(86) PCT No.: PCT/JP2006/310552

§ 371 (c)(1),
(2), (4) Date: Feb. 14, 2008

(87) PCT Pub. No.: WO2006/129565

PCT Pub. Date: Dec. 7, 2006

(65) Prior Publication Data

US 2008/0213690 A1    Sep. 4, 2008

(30) Foreign Application Priority Data

May 30, 2005   (JP)   ............... 2005-156976

(51) Int. Cl.
*G03C 1/76*   (2006.01)
*G03C 1/494*   (2006.01)
*G03C 1/492*   (2006.01)
*G03C 5/00*   (2006.01)

(52) U.S. Cl. ................... 430/270.1; 430/296

(58) Field of Classification Search ............. 430/270.1, 430/296
See application file for complete search history.

(56) References Cited

U.S. PATENT DOCUMENTS 6,951,682 B1 * 10/2005 Zebala ................ 428/312.2

FOREIGN PATENT DOCUMENTS

| JP | 50-000827 | 1/1975 |
|---|---|---|
| JP | 56-019045 | 2/1981 |
| JP | 56-144536 | 11/1981 |
| JP | 63-0007978 | 1/1988 |
| JP | 03-129349 | 6/1991 |
| JP | 05-212967 | 8/1993 |
| JP | 05-263218 | 10/1993 |
| JP | 09-311439 | 12/1997 |
| JP | 10-097738 | 4/1998 |
| JP | 2001-135563 | 5/2001 |
| JP | 2003-315988 | 11/2003 |
| JP | 2004-504633 | 2/2004 |
| JP | 2004-090610 | 3/2004 |
| JP | 2004-152465 | 5/2004 |
| JP | 2004-348830 | 12/2004 |
| JP | 2005-011489 | 1/2005 |
| JP | 2005-100602 | 4/2005 |
| JP | 2006-004594 | 1/2006 |
| JP | 2006-116948 | 5/2006 |

OTHER PUBLICATIONS

International Search Report mailed Jun. 27, 2006.

* cited by examiner

*Primary Examiner*—Geraldina Visconti
(74) *Attorney, Agent, or Firm*—Nixon & Vanderhye P.C.

(57) ABSTRACT

The invention mainly intends to provide a resist material that is high in the sensitivity to light and an electron beam and enables to form a clear and fine pattern with less exposure. In order to achieve the object, the invention provides a resist material comprising a metal compound, wherein a metal element constituting the metal compound is a $14^{th}$ group or $15^{th}$ group metal element and the metal compound is a stoichiometrically incomplete compound.

4 Claims, 6 Drawing Sheets

RESIST MATERIAL AND ELECTRON BEAM RECORDING RESIST MATERIAL

This application is the U.S. national phase of International Application No. PCT/JP2006/310552 filed 26 May 2006 which designated the U.S. and claims priority to JP 2005-156976 filed 30 May 2005, the entire contents of each of which are hereby incorporated by reference.

TECHNICAL FIELD

The present invention relates to a resist material and an electron beam recording resist material, which can form a clear and fine pattern with less exposure, a resist substrate and an electron beam recording resist substrate therewith, and a producing method of a pattern forming body.

BACKGROUND ART

So far, an organic resist material has been mainly used for applying micro-processing to optical devices, magnetic devices, semiconductor devices and others. The organic resist material, having the general versatility, has been widely used in a field of photolithography. However, the organic resist material, being high in molecular weight, has a problem in that a pattern at a boundary portion of an exposed portion and an unexposed portion tends to be obscure. Furthermore, since light or an electron beam is directly used for recording, it has been difficult to form a fine pattern smaller than a spot diameter of light or an electron beam.

On the other hand, an inorganic resist material, being smaller in molecular weight, has an advantage in that a pattern at a boundary portion of an exposed portion and an unexposed portion is clear. Accordingly, various researches are under way of the inorganic resist materials at present. For instance, Patent Document 1 discloses a method where a portion of a particular crystalline state of a chalcogen compound is selectively removed by making use of difference of etching rates due to difference of crystalline states of a chalcogen compound, to obtain an optical information recording medium master.

In the Patent Document 1, a method where heat generated by light exposure or the like is used to vary a crystalline state of a chalcogen compound is used, which method is called a heat mode recording. In the heat mode recording, only a portion where a temperature reaches or exceeds a certain threshold value causes a change in physical and chemical states and a portion where a temperature does not reach a threshold value, does not cause the change in physical and chemical states even when the portion is heated; accordingly, a clear pattern can be advantageously formed. Furthermore, in the heat mode recording, among a portion that is exposed to light or an electron beam, only a portion where a temperature reaches or exceeds a threshold value causes a change of state. Accordingly, a pattern finer than a spot diameter of light or an electron beam can be advantageously formed.

Furthermore, Patent Document 2 discloses a producing method of a master of optical information recording media, which uses the heat mode recording. It is described in the document that, according to the method, disposing a recording auxiliary layer besides a resist film may result in improved recording sensitivity and an effectively controlled etching shape after recording.

On the other hand, Patent Document 3 discloses a resist material that uses an incomplete oxide of a transition metal such as W or Mo as a resist film. In the Patent Document 3, it is intended to obtain fine patterns with an existing exposing device by making use of absorption of UV-ray or visible light of the incomplete oxide.

However, there is a problem in that each of the resist materials described in Patent Documents 1 to 3 tends to be insufficient in the sensitivity to light or an electron beam since the decomposition temperature thereof is high. Furthermore, Patent Document 2 studies to provide a recording auxiliary layer from the viewpoint of improving the recording sensitivity. However, there are objections that the number of processes increases and a layer structure becomes complicated when the recording auxiliary layer is disposed.

Furthermore, when an electron beam is used for recording, other problems occurs in some cases, where an electron beam penetrates toward a substrate without reacting with a resist material, or it causes a need for disposing a material such as electroconductive metal on a substrate or a substrate top surface in order to avoid charges of electrons. However, a countermeasure for that is not disclosed.

Patent Document 1: Japanese Patent Application Laid-Open No. 10-97738

Patent Document 2: Japanese Patent Application Laid-Open No. 2005-11489

Patent Document 3: Japanese Patent Application Laid-Open No. 2003-315988

DISCLOSURE OF THE INVENTION

Problems to be Solved by the Invention

In view of the above situations, a resist material and an electron beam recording resist material, which are high in the sensitivity to light or an electron beam and can form a clear and fine pattern with less exposure, are in demand.

Means for Solving the Problems

The invention provides a resist material comprising a metal compound, wherein a metal element constituting the metal compound is a $14^{th}$ group or $15^{th}$ group metal element and the metal compound is a stoichiometrically incomplete compound.

Furthermore, the invention provides a resist material comprising a metal compound, wherein the metal compound is a metal nitride and the metal compound is a stoichiometrically incomplete compound.

Still furthermore, the invention provides resist substrate comprising a substrate and a resist film formed on the substrate and made of the resist material as described above.

Furthermore, the invention provides an electron beam recording resist material comprising a metal compound, wherein a metal element constituting the metal compound is a $14^{th}$ group or $15^{th}$ group metal element.

Still furthermore, the invention provides an electron beam recording resist material comprising a metal compound, wherein the metal compound is a metal nitride.

Furthermore, the invention provides a producing method of a pattern forming body comprising steps of; forming a resist film made of the resist material as described above or an electron beam recording resist film made of the electron beam recording resist material as described above on a substrate, and irradiating an electron beam to the resist film or the electron beam recording resist film.

DESCRIPTION OF REFERENCE NUMERALS 1 substrate
1' metal substrate
2 resist film
3 recorded portion
4 unrecorded portion
5 heat storage layer
6 electron beam recording resist film
7 electron beam decelerating layer

BEST MODE FOR CARRYING OUT THE INVENTION

In what follows, a resist material, resist substrate, electron beam recording resist material, electron beam recording resist substrate and producing method of a pattern forming body according to the invention will be detailed.

A. Resist Material

In the beginning, a resist material of the invention will be described. A resist material of the invention is a resist material having a stoichiometrically incomplete metal compound. The "stoichiometrically incomplete metal compound" in the invention is defined as a compound where a composition ratio of a metal element and a non-metal element that combines with the metal element does not stoichiometrically coincide. By contrast, a metal compound where a composition ratio of a metal element and a non-metal element stoichiometrically coincides is defined as a "stoichiometrically complete metal compound".

For instance, in the case of a metal oxide $Bi_2O_3$ being considered as a metal compound, when a composition ratio is represented in terms of $Bi_{1-X}O_X$, in the case of X=0.6, the metal oxide can be said a "stoichiometrically complete oxide" and, in the case of X≠0.6, the metal oxide can be said a "stoichiometrically incomplete metal oxide". In general, a composition ratio of a non-metal element does not exceed an ideal composition ratio of a non-metal element determined by a valence of the metal element. Specifically, in this example, usually, X does not exceed 0.6, but is in the range of 0<X<0.6.

Furthermore, depending on metal elements, there are metal elements capable of having a plurality of valences and forming metal compounds different in the valence. When the composition ratio does not coincide stoichiometrically, it can be handled similarly as a "stoichiometrically incomplete metal oxide". The valence of a metal element of a metal oxide can be analyzed by means of a commercially available analyzer.

The resist material of the invention can be divided largely in two embodiments below depending on the kind of a metal compound used. That is, an embodiment where a metal element that constitutes the metal compound is a $14^{th}$ group or $15^{th}$ group metal element (first embodiment) and an embodiment where the metal compound is a metal nitride (second embodiment). In what follows, the two embodiments will be detailed.

1. First Embodiment

In the beginning, a resist material of the first embodiment of the invention will be described. The resist material of the embodiment is a resist material having a metal compound, a metal element constituting the metal compound being a $14^{th}$ group or $15^{th}$ group metal element and the metal compound being a stoichiometrically incomplete compound.

According to the embodiment, since a metal compound containing a $14^{th}$ group or $15^{th}$ group metal element is used, a resist material capable of forming a clear and fine pattern with less exposure can be formed. This is because the decomposition temperature of a metal compound containing a $14^{th}$ group or $15^{th}$ group metal element is lower than that of a metal compound containing a transition metal element that is used in known resist materials. The decomposition temperature of a metal compound is a temperature at or over which a metal compound is debonded only by heat energy, and substantially coincides with the melting point in most of the metal compounds. However, in a compound having the sublimation temperature lower than the melting temperature thereof, the decomposition temperature coincides with the sublimation temperature. That is, in known resist materials that use a transition metal element, the sensitivity to light or an electron beam is low, and much exposure is necessary in order to obtain a desired pattern, since the decomposition temperature of the transition metal compound is high. On the other hand, a resist material of the embodiment, being low in the decomposition temperature, becomes higher in the sensitivity to light or an electron beam and thereby a clear pattern can be formed with less exposure.

Figure 1A:
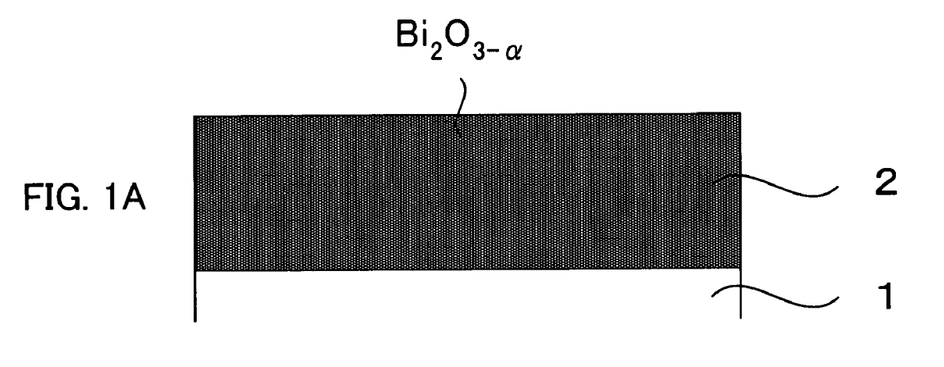
FIGS. 1A to 1C is an explanatory diagram showing a change of state when a resist material of the invention is exposed to light.
Figure 1B:
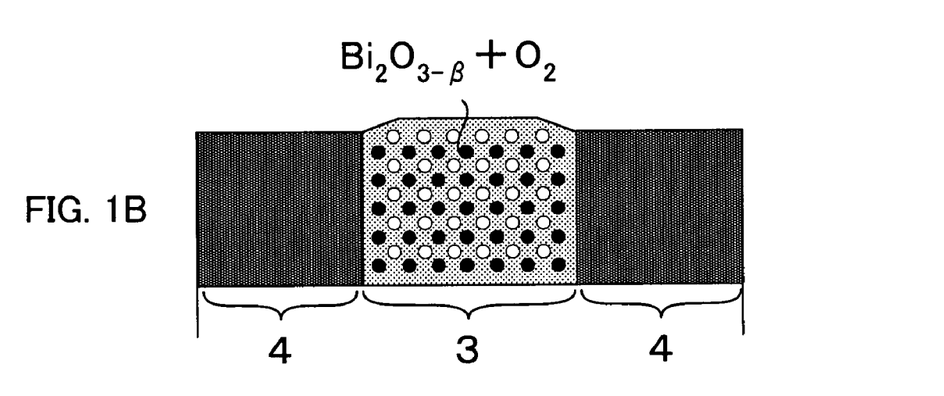
Figure 1C:
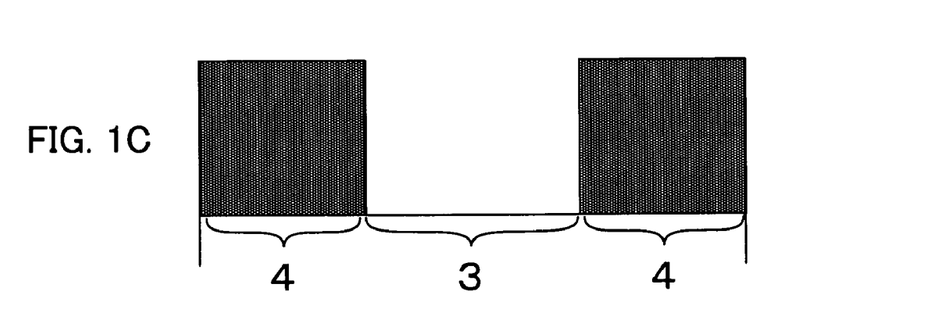

Next, examples of applications of the resist material of the embodiment will be described with reference to the drawings. For instance, as shown in FIG. 1A, a member that has a substrate 1 and a resist film 2 made of a resist material $Bi_2O_{3-\alpha}$ is prepared. Then, as shown in FIG. 1B, when light or an electron beam is irradiated, only a portion that is heated to a temperature equal to or higher than a predetermined threshold value is decomposed to $Bi_2O_{3-\beta}$ and $O_2$ to form a recorded portion 3. At that time, it is considered that the recorded portion 3, due to elimination of $O_2$, forms a porous structure. Since only a portion that reaches a temperature equal to or higher than a predetermined threshold value becomes a recorded portion 3 among a portion that is irradiated by light or an electron beam, a fine pattern smaller than a spot diameter of light or an electron beam can be formed. On the other hand, a portion that does not reach a temperature equal to or higher than the threshold value, even when it is heated, without causing a decomposition reaction, becomes as it is an unrecorded portion 4. Furthermore, a crystalline state of the recorded portion 3 becomes a crystalline state different from that of the unrecorded portion 4, thereby the solubility to a developing agent is varied, and, as shown in FIG. 1C, only the recorded portion 3 can be removed.

Next, a metal compound used in the embodiment will be described. Here, a metal compound used in the embodiment is defined as $M_{1-X}A_X$ (M denotes a metal element; A, a non-metal element; and X, a composition ratio A in a metal compound.).

The M may represent a single metal element or a plurality of metal elements. When the M represents a single metal element, the M is not particularly restricted as far as it is a metal element of the $14^{th}$ group or $15^{th}$ group. Specifically, Si, Ge, Sn, Pb, As, Sb and Bi can be cited and Bi, Sn and Ge are preferable.

Furthermore, when the M represents a plurality of metal elements, the M is not particularly restricted as far as it has a $14^{th}$ group or $15^{th}$ group metal element. For instance, ones having a plurality of $14^{th}$ group or $15^{th}$ group metal elements or ones having a $14^{th}$ group or $15^{th}$ group metal element and a metal element other than that can be cited. At this time, as the $14^{th}$ group or $15^{th}$ group metal element, Bi, Sn and Ge are preferable. In the present embodiment, the M preferably includes at least one metal element selected from a group of Bi, Sn and Ge and at least one metal element selected from a group of Si, Cu, Fe, Ti and Al. This is because a resist material capable of forming a clear and fine pattern can be obtained. Furthermore, the M, when combined together with A below, becomes a metal compound having a different decomposition temperature. Accordingly, in the invention, an A described below is preferably appropriately selected so that a compound of a metal element of at least one kind of the M and A may be a metal compound lower in the decomposition temperature.

As the A, specifically, O, N and C can be cited, and O and N are preferable and N is particularly preferable. This is because a resist material that can obtain a clear resist pattern with less exposure can be obtained. In the above, a metal oxide is obtained when the A is O, a metal nitride is obtained when the A is N and a metal carbide is obtained when the A is C. That is, as the metal compound, a metal oxide, metal nitride and metal carbide can be cited, and the metal oxide and metal nitride are preferable and the metal nitride is particularly preferable.

Furthermore, a range of X is largely different depending on applications of the resist material, and is not particularly restricted. However, as the composition ratio of a non-metal element (for instance nitrogen) becomes lower, the metal compound becomes stronger in the property as the metal, that is, while light absorption increases, the thermal conductivity as well increases to be incapable of storing heat; accordingly, it is necessary to pay attention to lowering of the sensitivity. On the other hand, as the composition ratio of the non-metal element (for instance, nitrogen) becomes higher, the compound approaches a stoichiometrically complete metal compound (for instance, nitride), that is, the light absorption cannot be improved. Accordingly, it is necessary to pay attention to a case where exposure with UV-ray or visible light may become difficult.

When a value of X is studied in detail, it is found that, with X that becomes a stoichiometric composition ratio assigned to 100%, X is desirably in the range of 75% to 95% from the viewpoint of a balance between the light absorption and thermal conduction. When an electron beam is used for recording, since there is no need of considering light absorptivity, a compound may well be one necessarily sufficient for a reaction. Accordingly, in comparison with the recording with light, either one that is close to a stoichiometrically complete metal compound (for instance, nitride) or a complete metal compound (for instance, nitride) can be used. That is, X is desirably in the range of 75% to 100%.

Furthermore, the melting temperature of a metal compound used in the present embodiment is not restricted particularly. However, specifically, the melting temperature is preferably in the range of 0° C. to 1500° C., more preferably in the range of 100° C. to 1200° C. and particularly in the range of 200° C. to 1000° C. This is because, when the melting temperature is higher than the range, the sensitivity to light or an electron beam tends to be insufficient and, when the melting temperature is lower than the range, the stability of the metal compound is deteriorated. Furthermore, from the viewpoint of the stability of a metal compound at normal temperature, the melting temperature of the metal compound is preferably 200° C. or higher. Still furthermore, in Table 1, an example of the melting temperatures of $14^{th}$ group or $15^{th}$ group metal compounds and transition metal compounds is shown. As obvious from Table 1, the melting temperatures of the $14^{th}$ group or $15^{th}$ group metal compounds are lower as a whole in comparison with that of the transition metal compounds.

TABLE 1

| 14th, 15th Group Metal Compound | | | | Transition Metal Compound | | | |
| --- | --- | --- | --- | --- | --- | --- | --- |
| Name of Compound | Melting Temperature | Name of Compound | Melting Temperature | Name of Compound | Melting Temperature | Name of Compound | Melting Temperature |
| $Bi_2O_3$ | 820° C. | $Sb_2O_3$ | 655° C. | $TiO_2$ | 1640° C. | NiO | 1998° C. |
| $GeO_2$ | 1116° C. | $As_2O_3$ | 313° C. | TiO | 1750° C. | BaO | 1923° C. |
| $SnO_2$ | 1127° C. | GeO | 700° C. | $Cr_2O_3$ | 1990° C. | MnO | 1650° C. |
| BiN | Ca. 220° C. | | | CoO | 1935° C. | MgO | 2880° C. |
| SnN | Ca. 380° C. | | | $ZrO_2$ | 2700° C. | ZnO | 1725° C. (sublimation temperature) |
| $PbO_2$ | 290° C. | | | FeO | 1370° C. | | |

Furthermore, the resist material of the embodiment may include a heat generating agent that converts light or an electron beam to heat. Such heat generating agent is not particularly restricted. Specifically, noble metals such as Pd, Ag, Au and Pt can be cited. Still furthermore, halogen elements such as F, Cl, Br and I high in the electron affinity and metal halides such as LiF, NaCl, KBr, $CaF_2$, $MgF_2$, $AlF_3$ and $BiF_3$ have an effect of converting an electron beam to heat and can be effectively contained in the resist material.

Still furthermore, usage of the resist material of the invention, without particularly restricting, includes optical devices, magnetic devices and semiconductor devices. Furthermore, the resist material of the embodiment may be an electron beam recording resist material or an optical recording resist material. However, the electron beam recording resist material is more preferable among them. This is because a finer pattern can be formed.

A producing method of the resist material of the embodiment is not particularly restricted as far as it can obtain a resist material capable of forming a clear and fine pattern with less exposure. Specifically, a reactive sputtering method and vapor deposition method can be cited. An example of a producing method of a resist material, which uses the reactive sputtering method includes, a method where sputtering is carried out in an argon and oxygen atmosphere with a sputter target made of a $14^{th}$ group or $15^{th}$ group metal, to obtain a stoichiometrically incomplete metal oxide. At this time, an oxygen composition ratio in the metal oxide can be controlled by varying an oxygen concentration. Furthermore, a metal oxide having a plurality of metal elements can be obtained using a sputter target having a plurality of metal. Still furthermore, when a stoichiometrically incomplete metal nitride is to be formed, a reactive sputtering method may well be carried out in an argon and oxygen atmosphere.

2. Second Embodiment

Next, a resist material of the second embodiment of the invention will be described. The resist material of the present embodiment is a resist material having a metal compound, the metal compound being a metal nitride and the metal compound being a stoichiometrically incomplete compound.

According to the embodiment, a resist material capable of forming a clear pattern with less exposure can be formed owing to use of a metal nitride. This is because the decomposition temperature of the metal nitride is lower than that of a metal oxide or the like used in known resist materials.

Figure 2A:
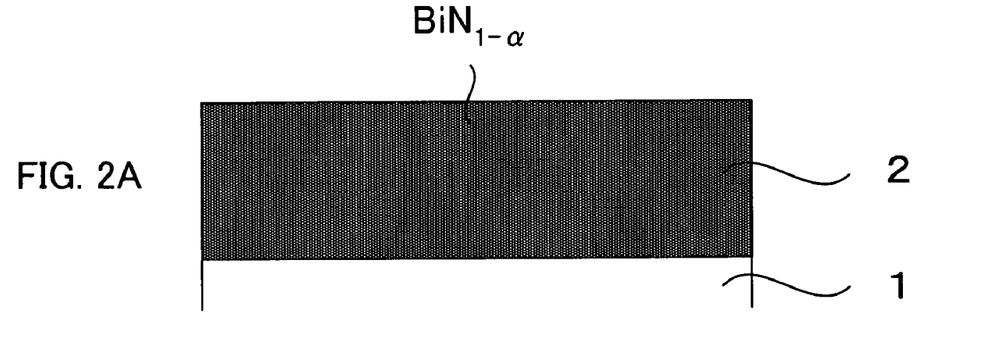
FIGS. 2A to 2C is an explanatory diagram showing a change of state when a resist material of the invention is exposed to light.
Figure 2B:
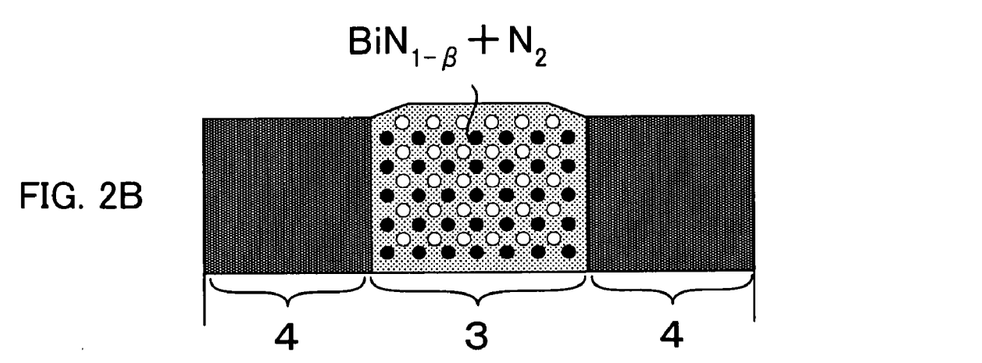
Figure 2C:
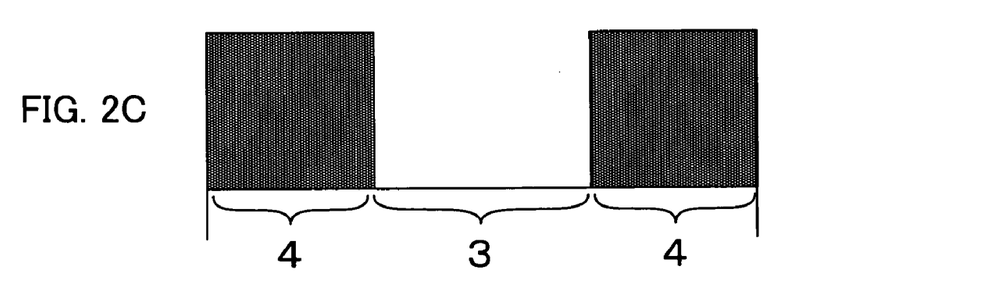

Next, examples of applications of the resist material of the embodiment will be described with reference to the drawings. For instance, as shown in FIG. 2A, a member having a substrate 1 and a resist film 2 made of a resist material $BiN_{1-\alpha}$ is prepared. Then, as shown in FIG. 2B, when light or an electron beam is irradiated, only a portion that is heated to a temperature equal to or higher than a predetermined threshold value is decomposed to $BiN_{1-\beta}$ and $N_2$ to form a recorded portion 3. At that time, it is considered that the recorded portion 3, due to elimination of $N_2$, forms a porous structure. Among a portion that is exposed by light or an electron beam, only a portion that reaches a temperature equal to or higher than a predetermined threshold value becomes a recorded portion 3; accordingly, a fine pattern smaller than a spot diameter of light or the electron beam can be formed. On the other hand, a portion that does not reach a temperature equal to or higher than the threshold value does not cause a decomposition reaction, even when it is heated, but becomes as it is an unrecorded portion 4. Furthermore, a crystalline state of the recorded portion 3 becomes a crystalline state different from that of the unrecorded portion 4, thereby the solubility to a developing agent is varied, and, as shown in FIG. 2C, only the recorded portion 3 can be removed.

Next, a metal compound used in the embodiment will be described. Here, a metal compound used in the embodiment is defined as $M_{1-X}N_X$ (M denotes a metal element; N, nitrogen element; and X, a composition ratio of N in a metal nitride.).

The M may represent a single metal element or a plurality of metal elements. When the M represents a single metal element, the M is not particularly restricted as far as it can form a metal nitride. However, $14^{th}$ group or $15^{th}$ group metal elements are preferable and among the $14^{th}$ group or $15^{th}$ group metal elements, Bi, Sn and Ge are preferable.

Furthermore, when the M represents a plurality of metal elements, the M is not particularly restricted as far as it is a combination of metal elements that can form a metal nitride. However, for instance, ones having $14^{th}$ group or $15^{th}$ group metal elements can be cited. In such a case, as the M, ones having a plurality of $14^{th}$ group or $15^{th}$ group metal elements or ones having a $14^{th}$ group or $15^{th}$ group metal element and a metal element other than that can be cited. At this time, the $14^{th}$ group or $15^{th}$ group metal elements are preferable to be Bi, Sn and Ge. In the embodiment, the M preferably includes at least one metal element selected from a group of Bi and Sn and at least one metal element selected from a group of Ge, Si, Cu, Fe, Ti and Al. This is because a resist material capable of forming a clear and fine pattern can be obtained.

Furthermore, a range of the X is largely different depending on applications of the resist material, and is not particularly restricted. However, as the composition ratio of a nitrogen element becomes smaller, the metal nitride becomes stronger in the property as the metal, that is, while light absorption increases, the thermal conductivity as well increases to be incapable of storing heat; accordingly, it is necessary to pay attention to lowering of the sensitivity. On the other hand, as the composition ratio of a nitrogen element becomes higher, the compound approaches a stoichiometrically complete metal nitride, that is, the light absorption cannot be improved. Accordingly, it is necessary to pay attention to a case where exposure with UV-ray or visible light becomes difficult.

When a value of X is studied in detail, it is found that, with X that becomes a stoichiometric composition ratio assigned to 100%, X is desirably in the range of 75% to 95% from the viewpoint of balance between the light absorption and thermal conduction. When the electron beam is used for recording, since there is no need of considering light absorptivity, a compound may be one necessarily sufficient for a reaction. Accordingly, in comparison with a recording method that uses light, both of one that is close to a stoichiometrically complete metal nitride and a complete metal nitride can be used. That is, X is desirably in the range of 75% to 100%.

Furthermore, the melting temperature of a metal nitride used in the embodiment is not restricted particularly. However, specifically, the melting temperature is preferably in the range of 0° C. to 1500° C., more preferably in the range of 100° C. to 1000° C. and still more preferably in the range of 200° C. to 400° C. This is because, when the melting temperature is higher than the range, the sensitivity to light or an electron beam tends to be insufficient and, when the melting temperature is lower than the range, the stability of the metal nitride is unfavorably poor. Furthermore, from the viewpoint of the stability of a metal nitride at normal temperature, the melting temperature of the metal nitride is preferably 200° C. or higher. Still furthermore, in Table 2, examples of the melting temperatures of metal nitrides and metal oxides are shown. As obvious from Table 2, the melting temperatures of the metal nitrides are lower as a whole in comparison with that of the metal oxides.

TABLE 2

| Metal Nitride | | Metal Oxide | | | |
|---|---|---|---|---|---|
| Name of Compound | Melting Temperature | Name of Compound | Melting Temperature | Name of Compound | Melting Temperature |
| AgN | Ca. 25° C. | TiO$_2$ | 1640° C. | NiO | 1998° C. |
| Na$_3$N | Ca. 200° C. | TiO | 1750° C. | BaO | 1923° C. |
| BiN | Ca. 220° C. | Cr$_2$O$_3$ | 1990° C. | MnO | 1650° C. |
| Cu$_3$N | Ca. 300° C. | CoO | 1935° C. | MgO | 2880° C. |
| Fe$_2$N | Ca. 350° C. | ZrO$_2$ | 2700° C. | ZnO | 1725° C. (sublimation temperature) |
| SnN | Ca. 380° C. | FeO | 1370° C. | | |

Furthermore, the resist material of the embodiment may include a heat generating agent that converts light or an electron beam to heat. As such a heat generating agent, since ones similar to that described in the first embodiment can be used, descriptions thereof will not be repeated here. Still furthermore, descriptions for applications, producing methods and the like of the resist material of the embodiment as well, being similar to one described in the first embodiment, will not be repeated here.

B. Resist Substrate

Next, a resist substrate of the invention will be described. The resist substrate of the invention includes a substrate and a resist film formed on the substrate and formed by use of the resist material.

According to the invention, the resist substrate includes a resist film made of the resist material; accordingly, a clear and fine pattern can be advantageously formed with less exposure.

As the substrate used in the invention, ones similar to substrates used in general resist substrates can be used. The description for resist material and the like used in the invention, being similar to the content described in "A. Resist Material", are not repeated here. As a method of forming a resist film on a substrate, for instance, a reactive sputtering method and a vapor deposition method can be cited.

In the invention, it is preferable that the substrate is a metal substrate and a heat storage layer is formed between the metal substrate and the resist film. This is because when a heat storage layer is disposed, heat can be advantageously kept even in the heat mode recording even when a metal substrate high in the thermal conductivity is used. When a substrate that is low in the thermal conductivity and has per se the heat storage property such as a glass substrate or a resin substrate is used, the heat storage layer may not be provided.

Figure 3:
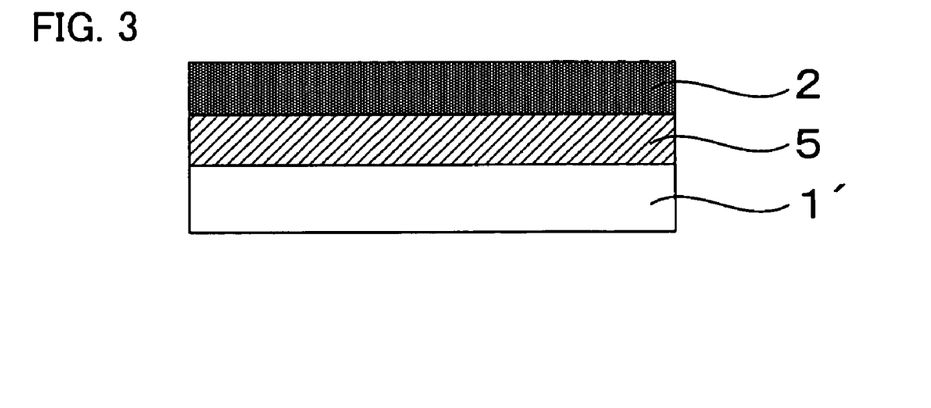
FIG. 3 is a schematic sectional diagram showing an example of a resist substrate of the invention.

FIG. 3 is a schematic sectional view showing an example of a resist substrate having a heat storage layer. A resist substrate shown in FIG. 3 includes a metal substrate 1', a heat storage layer 5 formed on the metal substrate 1' and a resist film 2 formed on the heat storage layer 5.

A material of the metal substrate is not particularly restricted as far as it has high thermal conductivity. A metal plate made of silicon or aluminum can be cited.

A material of the heat storage layer is not particularly restricted as far as it can retain heat. Examples thereof include metal compounds such as metal nitrides, metal oxides, metal carbides, metal sulfides, metal selenides and mixtures thereof, which are low in the thermal conductivity. Among them, dielectric materials that use a metal different from the metal compound used in the resist film are preferable, in particular, general and preferable one is ZnS—SiO$_2$. Furthermore, in the heat storage layer, a resin material as well can be used.

When an electron beam is used for recording in particular, in order to inhibit electrons from charging a substrate to affect on the electron beam, it is necessary to provide a material high in the electroconductivity such as a metal as a substrate or on a top surface of the substrate; accordingly, a heat storage layer is effective in order to satisfy both high electroconductivity and low thermal conductivity.

A thickness of the heat storage layer is, without particularly restricting, preferably in the range of 10 nm to 1000 nm and still more preferably in the range of 20 nm to 400 nm. When the thickness is too small, an advantage of heat storage is insufficient; and when it is too large, the productivity is deteriorated, a surface property of the film is deteriorated and peeling or cracking due to stress of the film are caused.

A producing method of the heat storage layer is not particularly restricted as far as it can form the heat storage layer. Specifically, when a material of the heat storage layer is the metal compound, for example, a sputtering method and a vapor deposition method can be cited.

Furthermore, in the invention, when the electron beam is used for recording, an electron beam decelerating layer is preferably formed on the resist layer. This is because when the electron beam decelerating layer is disposed, many electrons react with a resist film to be able to efficiently convert the electron beam to heat. The electron beam decelerating layer will be detailed in "D. Electron Beam Recording Resist Substrate" described below and are not described here.

C. Electron Beam Recording Resist Material

Next, an electron beam recording resist material of the invention will be described. The electron beam recording resist material of the invention is used in the electron beam recording and can be largely divided in two embodiments below depending on the kind of a metal compound, that is, an embodiment (third embodiment) where a metal element that constitutes the metal compound is a 14$^{th}$ group or 15$^{th}$ group metal element and an embodiment (fourth embodiment) where the metal compound is a metal nitride. In what follows, the two embodiments will be detailed.

1. Third Embodiment

In the beginning, an electron beam recording resist material of the third embodiment of the invention will be described. The electron beam recording resist material of the present embodiment is an electron beam recording resist material having a metal compound, a metal element constituting the metal compound being a 14$^{th}$ group or 15$^{th}$ group metal element.

According to the embodiment, when a metal compound containing a 14$^{th}$ group or 15$^{th}$ group metal element is used, an electron beam recording resist material capable of forming a clear and fine pattern with less exposure can be formed. This is because the decomposition temperature of a metal compound containing a $14^{th}$ group or $15^{th}$ group metal element is lower than that of a metal compound containing a transition metal element that is used in known resist materials. The decomposition temperature of a metal compound is a temperature at or over which a metal compound is debonded only by heat energy and substantially coincides with the melting point in most of the metal compounds. However, in a compound where the sublimation temperature is lower than the decomposition temperature, the decomposition temperature coincides with the sublimation temperature. That is, in known resist materials that use a transition metal element, since the decomposition temperature of the transition metal compound is high, the sensitivity to an electron beam is low and, in order to obtain a desired pattern, much exposure is necessary. On the other hand, an electron beam recording resist material of the embodiment, being low in the decomposition temperature, becomes higher in the sensitivity to an electron beam and thereby a clear pattern can be formed with less exposure.

A metal compound that is used in the embodiment may be either one of a "stoichiometrically complete metal compound" or a "stoichiometrically incomplete metal compound". The definition thereof is the same as that described in "A. Resist Material"; accordingly, description is not repeated here. Furthermore, the resist material of the embodiment may include a heat generating agent that converts an electron beam to heat. Furthermore, specific producing methods of the metal compounds, heat generating agents and electron beam recording resist materials are the same as that described in "A. Resist Material 1. First Embodiment"; accordingly, descriptions thereof will not be repeated here. In particular, in the present embodiment, the metal compound is preferably a metal oxide.

2. Fourth Embodiment

Next, an electron beam recording resist material of the fourth embodiment of the invention will be described. The electron beam recording resist material of the embodiment is an electron beam recording resist material having a metal compound, the metal compound being a metal nitride.

According to the embodiment, when a metal nitride is used, an electron beam recording resist material capable of forming a clear pattern with less exposure can be formed. This is because the decomposition temperature of a metal nitride is lower than that of a metal oxide that is used in known resist materials.

A metal nitride that is used in the embodiment may be either one of a "stoichiometrically complete metal compound" or a "stoichiometrically incomplete metal compound". The definition thereof is the same as that described in "A. Resist Material"; accordingly, descriptions thereof will not be repeated here. Furthermore, the resist material of the embodiment may include a heat generating agent that converts an electron beam to heat. Furthermore, specific producing methods of the metal nitrides, heat generating agents and electron beam recording resist materials are the same as that described in "A. Resist Material 2. Second Embodiment"; accordingly, descriptions thereof will not be repeated here.

D. Electron Beam Recording Resist Substrate

Next, an electron beam recording resist substrate of the invention will be described. The electron beam recording resist substrate includes a substrate and an electron beam recording resist film formed on the substrate and made of the electron beam recording resist material.

According to the invention, the electron beam recording resist substrate includes the electron beam recording resist film made of the electron beam recording resist material; accordingly, a clear and fine pattern can be advantageously formed with less exposure.

As a substrate used in the invention, one the same as that used in general resist substrates can be used. Furthermore, the electron beam recording resist materials used in the invention are the same as that described in "C. Electron Beam Recording Resist Material"; accordingly, descriptions thereof will not be repeated here. As a method of forming an electron beam recording resist film on a substrate, for instance, a reactive sputtering method and a vapor deposition method can be cited.

In the invention, it is preferable that the substrate is a metal substrate and a heat storage layer is formed between the metal substrate and the resist film. This is because when a heat storage layer is disposed, even when a metal substrate high in the thermal conductivity is used, heat can be advantageously retained even in the heat mode recording. The metal substrate, the heat storage layer and the like are the same as that described in "B. Resist Substrate"; accordingly, descriptions thereof will not be repeated here.

Furthermore, in the invention, an electron beam decelerating layer is preferably formed on the electron beam recording resist film. The electron beam decelerating layer is disposed to inhibit most of the electron beams that intrude at high-speed under an acceleration voltage from going through toward a substrate without reacting with the electron beam recording resist film. Electrons, when going through the electron beam decelerating layer material, are decelerated owing to collisions and thereby many electrons react with the resist film to efficiently convert electron beams to heat.

Figure 4:
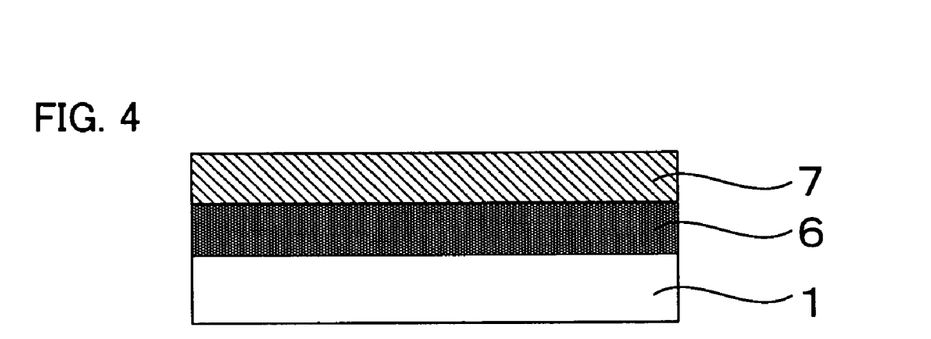
FIG. 4 is a schematic sectional diagram showing an example of an electron beam recording resist substrate of the invention.

FIG. 4 is a schematic sectional view showing an example of an electron beam recording resist substrate having an electron beam decelerating layer. An electron beam recording resist substrate shown in FIG. 4 includes a substrate 1, an electron beam recording resist film 6 formed on the substrate 1 and an electron beam decelerating layer 7 formed on the electron beam recording resist film 6.

As a material of the electron beam decelerating layer, a layer mainly made of a resin is preferable. Examples thereof include ones containing a UV-curable resin, a thermosetting resin, a thermosetting/UV-curing resin or a solvent vaporization resin. Specific examples of such resins include a urethane acrylate resin, an epoxy acrylate resin, a polyester resin, an epoxy resin, an acryl resin, a urethane resin, a styrene resin, a melamine resin, a polycarbonate resin, a polypropylene resin, a polyethylene resin, a polylactide resin, and a mixture resin thereof. Furthermore, a resin that is used as an electron beam resist (trade name: ZEP520A, produced by ZEON CORPORATION) and the like may be used in an electron beam decelerating layer.

Furthermore, for instance, the resin may include a heat generating agent that absorbs an electron beam and generates heat. Such heat generating agent is not particularly restricted. For instance, noble metals such as Pd, Ag, Au and Pt can be cited. Still furthermore, halogen elements such as F, Cl, Br and I high in the electron affinity and metal halides such as LiF, NaCl, KBr, $CaF_2$, $MgF_2$, $AlF_3$ and $BiF_3$ can be cited.

A thickness of the electron beam decelerating layer is, without particularly restricting, in the range of 10 μm to 600 μm and preferably in the range of 50 μm to 100 μm. This is because, when the thickness of the electron beam decelerating layer is too small, a decelerating effect becomes insufficient and, when the thickness is too large, the productivity is deteriorated.

A forming method of the electron beam decelerating layer is not particularly restricted as far as it can obtain the electron beam decelerating layer. A general coating method can be used.

The electron beam decelerating layer can be readily removed when an electron beam recording resist substrate, after recording thereon, is dissolved with formalin or subjected to $O_2$ plasma.

Figure 5:
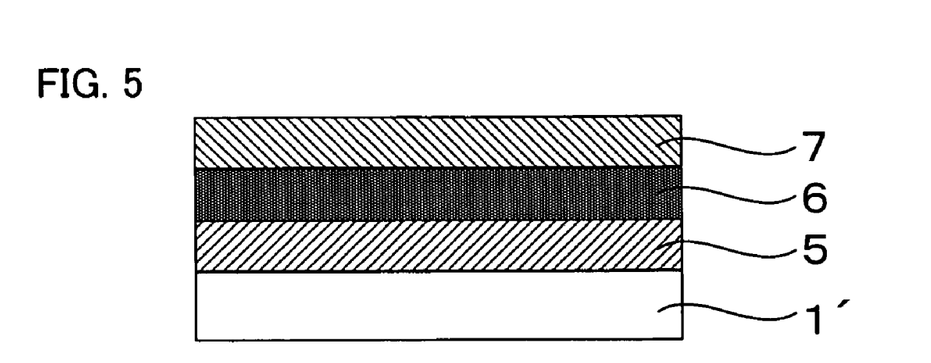
FIG. 5 is a schematic sectional diagram showing another example of an electron beam recording resist substrate of the invention.

Furthermore, the electron beam recording resist substrate of the invention may be provided with both a heat storage layer and an electron beam decelerating layer. Specifically, as shown in FIG. 5, an electron beam recording resist substrate that includes a metal substrate 1', a heat storage layer 5 formed on the metal substrate 1', an electron beam recording resist film 6 formed on the heat storage layer 5 and an electron beam decelerating layer 7 formed on the electron beam recording resist film 6 can be cited. When the electron beam recording resist substrate is provided with a heat storage layer, a metal substrate is usually used as a substrate.

E. Producing Method of Pattern Forming Body

Next, a producing method of a pattern forming body of the invention will be described. According to a producing method of the invention of a pattern forming body, after a resist film made of the resist material or an electron beam recording resist film made of the electron beam recording resist material is deposited on a substrate, an electron beam is irradiated on the resist film or the electron beam recording resist film.

The producing method of the invention of a pattern forming body can be divided in two embodiments, that is, an embodiment (fifth embodiment) where an electron beam recording resist film is formed with an electron beam recording resist material described in "C. Electron Beam Recording Resist Material", followed by irradiating an electron beam and an embodiment (sixth embodiment) where a resist film is formed with a resist material described in "A. Resist Material", followed by irradiating an electron beam. In what follows, the two embodiments will be detailed.

1. Fifth Embodiment

The fifth embodiment of a producing method of the invention of a pattern forming body will be described. A producing method of a pattern forming body in the present embodiment comprises steps of; forming an electron beam recording resist film made of the electron beam recording resist material as described above, and irradiating an electron beam to the electron beam recording resist film.

According to the embodiment, an electron beam capable of irradiating at a spot diameter smaller than that of light illumination is irradiated to an electron beam recording resist film made of the electron beam recording resist material, and thereby a pattern forming body having a further finer pattern can be formed. Applications of the pattern forming body obtained according to the embodiment, without particularly restricting, include optical devices, magnetic devices, semiconductor devices and display devices.

In what follows, the producing method of the embodiment of the pattern forming body will be described divided into: a step of forming an electron beam recording resist film where an electron beam recording resist film made of an electron beam recording resist material is formed on a substrate; a step of exposing where an electron beam is irradiated on the electron beam recording resist film to form a latent image pattern; and a step of developing where a convexo-concave pattern is formed from the latent image pattern.

(1) Step of Forming Electron Beam Recording Resist Film

In this step, an electron beam recording resist film made of the electron beam recording resist material is formed on a substrate.

In the step, a method of forming an electron beam recording resist film on a substrate is not particularly restricted, and examples thereof include a reactive sputtering method and a vapor deposition method.

Furthermore, an electron beam recording resist film obtained according to the step includes a metal compound. Descriptions for such metal compounds, being similar to ones described in "C. Electron Beam Recording Resist Material", are not repeated here. In particular, in the present embodiment, a metal element that constitutes the metal compound is preferably a heavy element. This is because a mean free path of electrons at electron collision becomes shorter by using the heavy element, resulting in high density reaction of electrons. Accordingly, for instance, when a metal element that constitutes a metal compound is a $14^{th}$ group or $15^{th}$ group metal element, Sn, Sb, Pb or Bi is preferable.

The electron beam recording resist film obtained according to the step may include a heat generating agent that converts an electron beam to heat. Such heat generating agents are similar to ones described in "A. Resist Material"; accordingly, descriptions thereof will not be repeated here.

A film thickness of the electron beam recording resist film obtained according to the step is, for instance, in the range of 5 nm to 500 nm and preferably in the range of 10 nm to 100 nm though it depends on applications of the pattern forming body.

Examples of the substrates used in the step include glass, plastics such as polycarbonate, silicon, alumina, titanium carbide, nickel and carbon, though it depends on applications of the pattern forming body of the embodiment. Furthermore, in the step, a heat storage layer may be disposed between the substrate and the electron beam recording resist film or an electron beam decelerating layer may be disposed on the electron beam recording resist film. The heat storage layer and the electron beam decelerating layer are the same as that described in "D. Electron Beam Recording Resist Substrate"; accordingly, descriptions thereof will not be repeated here.

(2) Exposure Step

In the step, an electron beam is irradiated on the electron beam recording resist film to form a latent image. In the step, when an electron beam is irradiated on an electron beam recording resist film made of the electron beam recording resist material, only a portion that is heated to a temperature equal to or higher than a predetermined threshold value causes a change of state. Accordingly, a fine pattern smaller than a spot diameter of an electron beam can be formed.

In the step, as a method of irradiating an electron beam on an electron beam recording resist film, without particularly restricting, a device used for a general electron beam drawing method can be used.

Furthermore, an accelerating voltage in the electron beam irradiation is, for instance, in the range of 5 kV to 500 kV and still more preferably in the range of 10 kV to 200 kV though it depends on applications of the pattern forming body.

(3) Development Step

This step is a step of forming a convexo-concave pattern from the latent image pattern. In the step, as described in "A. Resist Material", a crystalline structure of a portion heated to a temperature equal to or higher than a predetermined threshold value (latent image pattern) is different from a crystalline structure of other portion; accordingly, the solubility to a developing agent is varied. As the results, a convexo-concave pattern corresponding to the latent image pattern can be formed.

In the step, examples of methods of forming a convexo-concave pattern from the latent image pattern include, without particularly restricting, wet etching development that uses an alkali developing agent or an acid developing agent, dry etching development that is carried out with a gas such as argon or fluorocarbon in plasma.

The alkali developing solution is not particularly restricted as far as it can form a desired convexo-concave pattern. Specific examples thereof include an aqueous solution of tetramethyl ammonium, an aqueous solution of potassium hydroxide, an aqueous solution of sodium hydroxide, and an aqueous solution of sodium carbonate. Furthermore, a concentration of the alkali developing solution is preferable to be appropriately selected depending on the kind of a metal compound constituting an electron beam recording resist film.

Furthermore, the acid developing solution, is not particularly restricted as far as it can form a desired convexo-concave pattern. Specific examples thereof include an aqueous solution of hydrochloric acid, an aqueous solution of acetic acid, an aqueous solution of sulfuric acid, and an aqueous solution of phosphoric acid. A concentration of the acid developing solution is preferable to be appropriately selected in accordance with the kind of a metal compound constituting an electron beam recording resist film.

Furthermore, in the step, an ultrasonic generator may be used at the time of development. As described in "A. Resist Material", a portion that is heated to a temperature equal to or higher than a predetermined threshold value (latent image pattern) is considered to form a porous structure. Accordingly, the latent image pattern becomes lower in the mechanical strength in comparison with a portion that does not form a porous structure; accordingly, a convexo-concave pattern can be readily obtained when an ultrasonic generator is applied.

The dry etching method is not particularly restricted as far as it is a gas or a device that can form a desired convexo-concave pattern. Specific examples of etching gases include inert gases such as Ar, fluorocarbon base gases such as $CF_4$ and $C_2F_6$, fluoromethane gases such as $CHF_3$, and chlorine base gases such as $Cl_2$ and $BCl_3$. Examples of dry etching devices include an ion milling device, and a capacitance-coupled or induction-coupled reactive ion etching device. Furthermore, the kind, pressure and flow rate of the gas and conditions such as an etching device, etching power are preferable to be appropriately selected in accordance with the kind of a metal compound constituting an electron beam recording resist film.

2. Sixth Embodiment

A sixth embodiment of a producing method of the invention of a pattern forming body will be described. A producing method of a pattern forming body in the present embodiment comprises steps of; forming as described above, and irradiating an electron beam to the resist film.

According to the embodiment, an electron beam capable of irradiating with a spot diameter smaller than that of the light illumination is irradiated to a resist film made of a resist material including a stoichiometrically incomplete metal compound, to enable to obtain a pattern forming body having a further finer pattern. Examples of applications of the pattern forming body obtained according to the embodiment, without restricting particularly, include optical devices, magnetic devices, semiconductor devices and display devices.

In what follows, a producing method of the embodiment of the pattern forming body will be described divided in: a resist film forming step for forming a resist film on a substrate with the resist material; an exposing step of irradiating an electron beam on the resist film to form a latent image pattern; and a developing step of forming a convexo-concave pattern from the latent image pattern.

(1) Resist Film Forming Step

This step is a step where a resist film made of the resist material is formed on a substrate.

In the step, as a method of disposing a resist film on a substrate, without particularly restricting, a reactive sputtering method and a vapor deposition method can be cited. Such method is the same as that described in "A. Resist Material"; accordingly, descriptions thereof will not be repeated here.

Furthermore, a resist film obtained according to the step includes a stoichiometrically incomplete metal compound. Descriptions for such metal compounds, being similar to ones described in "A. Resist Material", are not repeated here. In particular, in the embodiment, a metal element that constitutes the metal compound is preferably a heavy element. This is because, when the heavy element is used, a mean free path of electrons at electron collision becomes shorter, resulting in high density reaction of electrons. Accordingly, for instance, when a metal element that constitutes a metal compound is a $14^{th}$ group or $15^{th}$ group metal element, Sn, Sb, Pb or Bi is preferable.

A film thickness of a resist film, the kind of substrate and others are the same as that described in "E. Producing Method of Pattern Forming Body 1. Fifth Embodiment"; accordingly, descriptions thereof will not be repeated here.

(2) Other Steps

The exposing step and development step in the embodiment are the same as that described in "E. Producing Method of Pattern Forming Body 1. Fifth Embodiment"; accordingly, descriptions thereof will not be repeated here.

The invention is not restricted to the exemplary embodiments. The exemplary embodiments are examples and all of ones having a configuration substantially the same as a technical idea described in claims of the invention and proving similar effect as the claims are contained in the technical range of the invention.

EXAMPLES

Example 1

With a substrate made of a polycarbonate resin having a thickness of 1.1 mm and a diameter of 12 cm, on the substrate, a Bi—Ge—N resist film having a thickness of 60 nm is deposited by sputtering a Bi—Ge target according to a reactive sputtering method in an atmosphere of $N_2$ gas of 20 sccm to Ar gas of 70 sccm to introduce nitrogen. The resist film is analyzed by use of an X-ray Photoelectron Spectroscopy (XPS) and found that an atomic ratio is Bi: 10 atomic %, Bi—N: 62 atomic % and Ge—N: 28 atomic %.

Next, 1-7 modified random pattern is recorded from the resist film side, at a line speed of 4.92 m/s, a wavelength of 405 nm, with an optical head having an object lens aperture of 0.85. The recording laser power is 8 mW, a multi-path is used for recording and a window width is set at 15.15 nsec.

Figure 6:
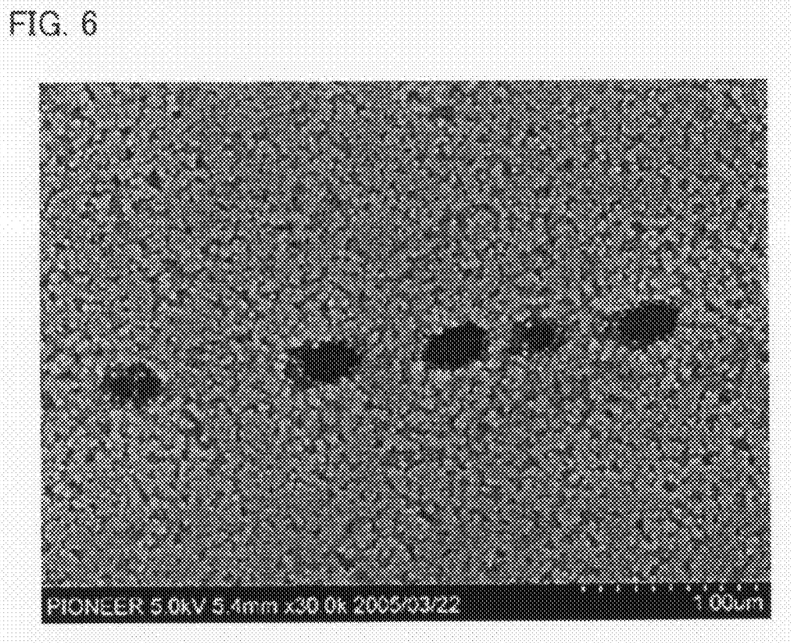
FIG. 6 is an image showing a result of alkali development in example 1.

Next, in a tetramethyl ammonium hydroxide solution (2.38% aqueous solution) that is an alkali developing agent, wet etching development is carried out. Since Bi—Ge—N is hardly dissolved in a tetramethyl ammonium hydroxide solution, ultrasonic is applied for 19 min to etch as dipped in the developing solution in order to accelerate the etching and to apply the etching uniformly on an overall surface. After the etching, pure water is used to thoroughly washing, followed by drying by air blow and thereby a sample is obtained. As the result, it is confirmed that, as shown in FIG. 6, a marked portion is selectively etched and the resist works.

Example 2

Figure 7:
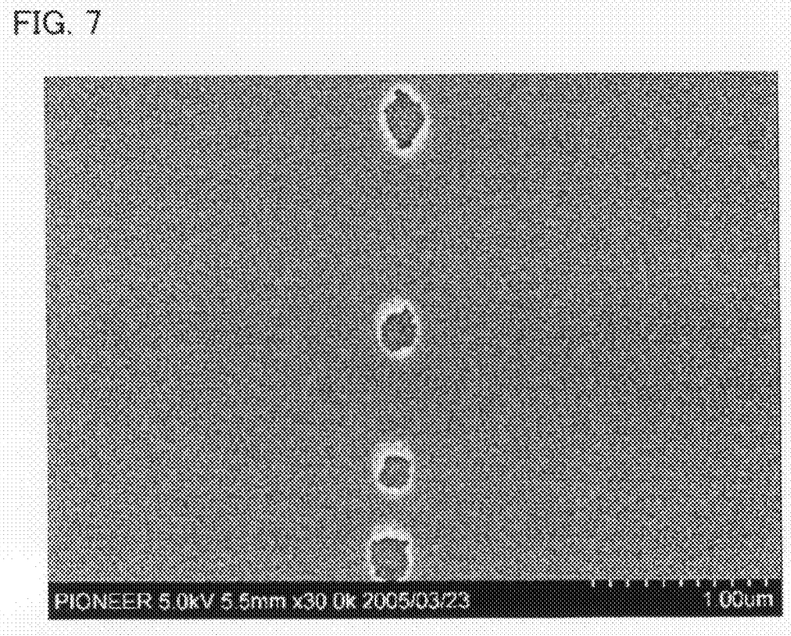
FIG. 7 is an image showing a result of acid development in example 2.

In place of the alkali development in example 1, acid development is carried out. Since Bi—Ge—N is dissolved in acid, wet etching development is carried out with an aqueous solution of 0.05% acetic acid as an acid developing solution. Specifically, in order to accelerate the etching and to apply the etching uniformly over an entire surface, the etching is applied for 19 min under application of the ultra sonic while dipping in the developing solution. After the etching, pure water is used to thoroughly washing, followed by drying by air blow to obtain a sample. As the result, it is confirmed that, in the acid development as well, as shown in FIG. 7, a marked portion is selectively etched and the resist works.

As described above, in the invention, when a stoichiometrically incomplete metal compound like the Bi—Ge—N resist film is used, a resist material that enables to form a clear and fine pattern with less exposure can be formed.

Example 3

After a ZnS—SiO$_2$ film having a thickness of 20 nm is formed on a silicon substrate having a thickness of 0.38 mm and a diameter of 3 inches as a heat storage layer according to a sputtering method, a Bi—Ge—N resist film is formed thereon by sputtering a Bi—Ge target according to a reactive sputtering method in an atmosphere of 20 sccm of N$_2$ gas to 70 sccm of Ar gas to introduce nitrogen.

Next, a line pattern is recorded from the resist film side, by use of an electron beam having an accelerating voltage of 50 keV, a beam current of 900 nA and a beam diameter of substantially 100 nm, at a line speed of 0.2 m/s and a pitch width of 0.32 μm.

Figure 8:
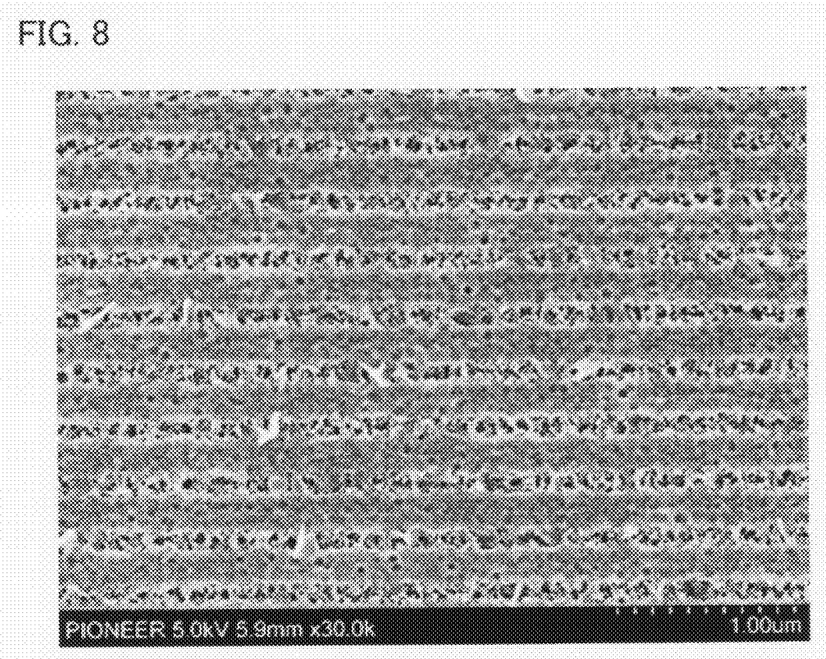
FIG. 8 is an image showing a result of acid development in example 3.

Next, in an aqueous solution of 0.02% acetic acid that is an acid developing agent, wet etching development is carried out. Specifically, the etching is applied for 19 min under application of ultrasonic to etch as dipped in the developing solution, in order to accelerate the etching and apply the etching uniformly over an entire surface. After etching, pure water is used to thoroughly washing, followed by drying by air blow and thereby a sample is obtained. As the result, it is confirmed that, as shown in FIG. 8, a recorded line portion is selectively etched to work as a resist.

Example 4

After a ZnS—SiO$_2$ film having a thickness of 400 nm is formed on a silicon substrate having a thickness of 0.38 mm and a diameter of 3 inches, as a heat storage layer according to a sputtering method, a Bi—O resist film having a thickness of 200 nm is formed thereon by sputtering a Bi target according to a reactive sputtering method in an atmosphere of 10 sccm of O$_2$ gas to 80 sccm of Ar gas to introduce oxygen.

Next, a line pattern is recorded from the resist film side, by use of an electron beam having an accelerating voltage of 50 keV, a beam current of 900 nA and a beam diameter of substantially 100 nm, at a line speed of 0.2 m/s and a pitch width of 0.32 μm.

Figure 9:
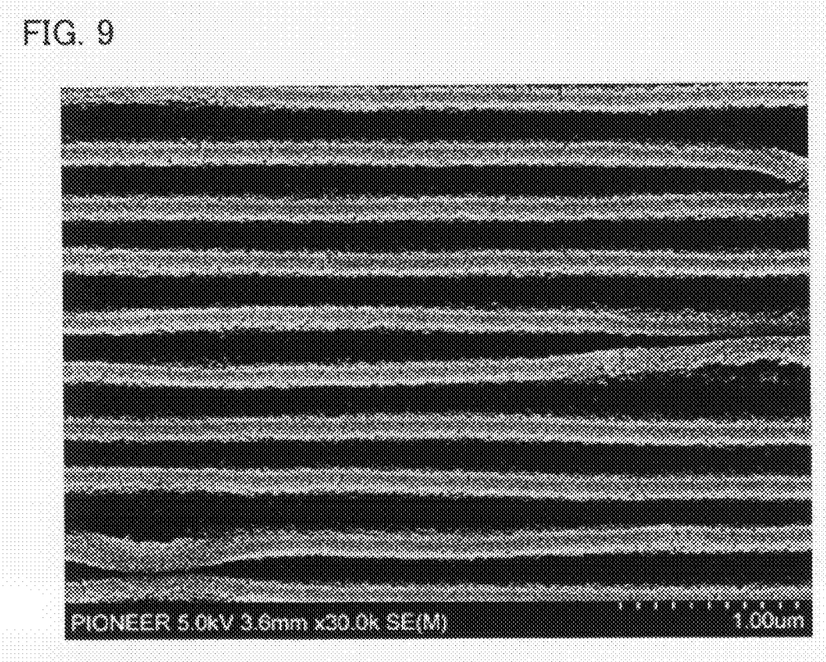
FIG. 9 is an image showing a result of acid development in example 4.

Next, wet etching development is carried out in an aqueous solution of 10% nitric acid that is an acid developing agent. Specifically, the etching is carried out for 45 sec dipped in a developing solution. After the etching, pure water is used to thoroughly washing, followed by drying by air blow and thereby a sample is obtained. As the result, it is confirmed that, as shown in FIG. 9, although a line pattern partially falls since an exposure time and a development time are slightly longer, a recorded line portion is selectively etched to work in principle as a resist.

Example 5

A line pattern is recorded to a resist substrate similar to example 4, from the resist film side, by use of an electron beam having an accelerating voltage of 50 keV, a beam current of 900 nA and a beam diameter of substantially 100 nm, at a line speed of 1.0 m/s and a pitch width of 0.32 μm.

Figure 10:
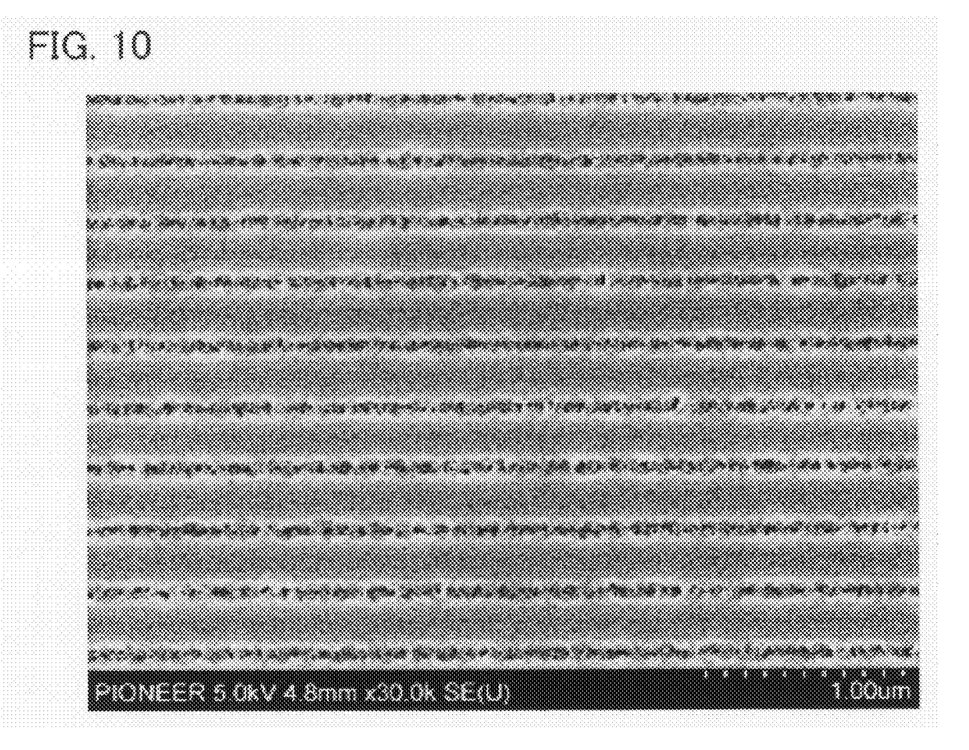
FIG. 10 is an image showing a result of dry etching development in example 5.

Next, dry etching development is carried out in place of acid development in example 4. Specifically, by use of a reactive ion etching device, a CHF$_3$ gas as an introducing gas is supplied at pressure of 0.5 Pa and a flow rate of 50 sccm to apply the etching for 10 min, with a plasma generation antenna RF power set at 50 W; a substrate bias RF power, at 10 W; and a substrate temperature, at 20° C. and thereby a sample is obtained. As the result, it is confirmed that, as shown in FIG. 10, a recorded line portion is selectively etched to work as a resist in the dry etching as well.

The invention claimed is:

1. A resist substrate comprising a substrate and a resist film formed on the substrate and made of a resist material, wherein
    a resist material includes a metal compound, a metal element constituting the metal compound is a 14th group or 15th group metal element, the metal compound is a metal oxide, the metal compound is a stoichiometrically incomplete compound and, when the metal compound is represented by $M_{1-X}O_X$ (M represents a metal element, O represents an oxygen element and X represents a composition ratio of O in a metal compound) and X that is a stoichiometrical composition ratio is assigned to 100%, X in the metal compound is in the range of 75% to 95%; and
    the substrate is a metal substrate and a heat storage layer is formed between the metal substrate and the resist film.

2. A producing method of a pattern forming body comprising steps of:
    forming a resist film, on a heat storage layer formed on a substrate, made of a resist material that includes a metal compound, a metal element constituting the metal compound is a $14^{th}$ group or $15^{th}$ group metal element, the metal compound is a metal oxide, the metal compound is a stoichiometrically incomplete compound and, when the metal compound is represented by $M_{1-X}O_X$ (M represents a metal element, O represents an oxygen element and X represents a composition ratio of O in a metal compound) and X that is a stoichimetrical composition ratio is assigned to 100%, X in the metal compound is in the range of 75% to 95%, and
    irradiating an electron beam to the resist film.

3. The resist substrate according to claim 1 wherein an electron beam decelerating layer is formed on the resist film.

4. The resist substrate according to claim 1 wherein a metal element constituting the metal compound is Bi.

\* \* \* \* \*